United States Patent
Langhammer et al.

(10) Patent No.: US 10,210,919 B2
(45) Date of Patent: Feb. 19, 2019

(54) INTEGRATED CIRCUITS WITH EMBEDDED DOUBLE-CLOCKED COMPONENTS

(71) Applicant: Altera Corporation, San Jose, CA (US)

(72) Inventors: Martin Langhammer, Salisbury (GB); Dana How, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 387 days.

(21) Appl. No.: 14/729,504

(22) Filed: Jun. 3, 2015

(65) Prior Publication Data

US 2016/0358638 A1  Dec. 8, 2016

(51) Int. Cl.
*G06F 1/10* (2006.01)
*G11C 8/18* (2006.01)
*H03K 19/177* (2006.01)

(52) U.S. Cl.
CPC .................. *G11C 8/18* (2013.01); *G06F 1/10* (2013.01); *H03K 19/17724* (2013.01)

(58) Field of Classification Search
CPC ...................................................... H05B 6/101
See application file for complete search history.

(56) References Cited

U.S. PATENT DOCUMENTS

| | | | | |
|---|---|---|---|---|
| 4,288,857 A * | 9/1981 | Wiltering | ............... | G06F 17/15 342/379 |
| 5,175,702 A | 12/1992 | Beraud et al. | | |
| 5,602,994 A * | 2/1997 | Ferron | ................. | G06F 13/4018 707/999.007 |
| 5,652,903 A | 7/1997 | Weng et al. | | |
| 5,740,404 A | 4/1998 | Baji | | |
| 5,802,387 A * | 9/1998 | Boddie | ............... | G06F 13/1678 711/169 |
| 5,872,993 A | 2/1999 | Brown | | |
| 6,088,784 A * | 7/2000 | Choquette | ............. | G06F 9/3001 712/32 |
| 6,624,766 B1 * | 9/2003 | Possley | ................. | H04L 7/0066 341/56 |

(Continued)

FOREIGN PATENT DOCUMENTS

| | | |
|---|---|---|
| CN | 1181661 A | 5/1998 |
| CN | 1549960 A | 11/2004 |
| CN | 101546185 A | 9/2009 |

*Primary Examiner* — Thomas C Lee
*Assistant Examiner* — Mohammad A Rahman
(74) *Attorney, Agent, or Firm* — Treyz Law Group, P.C.; Jason Tsai

(57) ABSTRACT

An integrated circuit that includes different types of embedded functional blocks such as programmable logic blocks, memory blocks, and digital signal processing (DSP) blocks is provided. At least a first portion of the functional blocks on the integrated circuit may operate at a normal data rate using a core clock signal while a second portion of the functional blocks on the integrated circuit may operate at a 2× data rate that is double the normal data rate. To support this type of architecture, the integrated circuit may include clock generation circuitry that is capable of providing double pumped clock signals having clock pulses at rising and falling edges of the core clock signal, data concentration circuitry at the input of the 2× functional blocks, and data spreading circuitry at the output of the 2× functional blocks.

17 Claims, 11 Drawing Sheets

(56) References Cited

U.S. PATENT DOCUMENTS

| | | | |
|---|---|---|---|
| 7,269,805 B1 * | 9/2007 | Ansari | G06F 11/27 |
| | | | 716/136 |
| 7,788,309 B2 * | 8/2010 | Wu | H03H 17/0671 |
| | | | 708/313 |
| 7,797,610 B1 | 9/2010 | Simkins | |
| 7,907,625 B1 * | 3/2011 | MacAdam | H04L 49/101 |
| | | | 370/357 |
| 8,325,719 B1 | 12/2012 | Loprieno et al. | |
| 8,384,592 B1 * | 2/2013 | Crary | G01S 19/24 |
| | | | 342/357.63 |
| 8,645,451 B2 | 2/2014 | Langhammer | |
| 8,977,885 B1 * | 3/2015 | Hazanchuk | G06F 5/06 |
| | | | 713/500 |
| 9,195,259 B1 * | 11/2015 | Matiash | G06F 9/30109 |
| 9,219,470 B1 * | 12/2015 | Venditti | H03K 5/1565 |
| 9,325,719 B2 | 4/2016 | Lloyd | |
| 9,634,950 B2 * | 4/2017 | Kwentus | H04W 88/181 |
| 2001/0015841 A1 * | 8/2001 | Rajan | H04Q 11/0005 |
| | | | 398/98 |
| 2003/0007513 A1 * | 1/2003 | Barker | H04J 3/22 |
| | | | 370/476 |
| 2005/0144210 A1 * | 6/2005 | Simkins | H03K 19/17732 |
| | | | 708/490 |
| 2005/0242855 A1 * | 11/2005 | Lee | H03L 7/07 |
| | | | 327/158 |
| 2007/0058572 A1 * | 3/2007 | Clauberg | H04J 3/08 |
| | | | 370/258 |
| 2007/0182475 A1 * | 8/2007 | Shimazaki | G06F 1/10 |
| | | | 327/295 |
| 2008/0091906 A1 * | 4/2008 | Brittain | A61C 17/349 |
| | | | 711/167 |
| 2008/0313579 A1 | 12/2008 | Larouche et al. | |
| 2010/0250635 A1 * | 9/2010 | Osada | G06F 7/5443 |
| | | | 708/205 |
| 2014/0177610 A1 * | 6/2014 | Kwentus | H04W 88/181 |
| | | | 370/338 |
| 2015/0030035 A1 * | 1/2015 | Kwentus | H04W 88/181 |
| | | | 370/473 |
| 2015/0063516 A1 * | 3/2015 | Nishiyama | G06F 13/4273 |
| | | | 375/373 |
| 2016/0103620 A1 * | 4/2016 | Kim | G06F 13/4243 |
| | | | 711/105 |

* cited by examiner

INTEGRATED CIRCUITS WITH EMBEDDED DOUBLE-CLOCKED COMPONENTS

BACKGROUND

This invention relates to programmable integrated circuits and more particularly, to programmable integrated circuits having embedded blocks that are double clocked.

A programmable integrated circuit such as a programmable logic device (PLD) typically includes programmable logic blocks, random access memory (RAM) blocks, and digital signal processing (DSP) blocks. The programmable logic blocks contain programmable memory elements that are loaded with configuration data, which configure the programmable logic blocks to implement a custom user function.

Conventionally, the different types of blocks on a programmable logic device operate using the same clock frequency (i.e., the programmable logic blocks, the RAM blocks, and the DSP blocks are clocked at the same rate). In an effort to improve the overall performance of the programmable logic device, techniques have been developed that involve use of a double data rate DSP block. For example, a DSP block on the device may be operated at 500 MHz while an associated programmable soft logic is operated at only 250 MHz. Such schemes, however, require redesigning the DSP block to operate at two times the frequency relative to the rest of the system, which can be costly and challenging to implement. Moreover, routing connections between the 500 MHz DSP block and the 250 MHz soft logic are oftentimes complex and introduce heavy routing stress, which can potentially reduce any performance gain provided by the faster DSP block.

It is within this context that the embodiments herein arise.

SUMMARY

An integrated circuit that includes embedded functional blocks such as programmable logic blocks, memory blocks (e.g., random-access-memory blocks), and digital signal processing (DSP) blocks, at least a portion of which is operated at different data rates is provided. In accordance with an embodiment, the integrated circuit may include a memory array operating at a first data rate, a DSP block operating at a second data rate that is greater than the first data rate (e.g., where the second data rate is equal to double the first data rate), and data rate concentration circuitry that receives stored data from the memory array at the first data rate and that outputs the stored data at the second data rate to the DSP block.

The data rate concentration circuitry may include a register for receiving first and second groups of data from the memory array, a multiplexer having a first input that receives the first group of data from the register and a second input that receives the second group of data from the register, and an additional register that only receives the second group of data from the memory array and that is coupled to the second input of the multiplexer. The register may be controlled by a first clock pulse signal toggling at the first data rate, whereas the additional register may be controlled by a second clock pulse signal that is different than the first clock pulse signal and that is also toggling at the first data rate (e.g., the first and second clock pulse signals may be out of phase with one another).

The integrated circuit may also include data rate spreading circuitry that receives processed data from the DSP block at the second data rate and that outputs the processed data at the first data rate. The data rate spreading circuitry may include a first register that receives the processed data from the DSP block and that is controlled by the first clock pulse signal toggling at the first data rate and a second register that receives the processed data from the DSP block and that is controlled by the second clock pulse signal that is also toggling at the first data rate. Other registers may be included for realigning the signals output from the first and second registers, if desired. This is merely illustrative. In other suitable embodiments, the data concentration circuitry and the data spreading circuitry may be formed at the interface between any two embedded functional blocks on the integrated circuit.

In accordance with another embodiment, the first and second clock pulse signals may be generated using clock generation circuitry that receives a core clock signal at the first data rate and that generates corresponding first and second clock pulse signals at the second data rate for facilitating communications between the different types of embedded functional blocks on the integrated circuit. In one suitable arrangement, the second data rate may be an integer multiple of the first data rate. In another suitable arrangement, the first data rate may be an integer multiple of the second data rate.

The clock generation circuitry may include a first pulse generator that generates first clock pulses at rising edges of the core clock signal, a second pulse generator that generates second clock pulses at falling edges of the core clock signal, and a multiplexer that receives the first and second clock pulses from the first and second pulse generators. The multiplexer may be a two-hot selection multiplexer that includes a logic OR gate (as an example).

In accordance with another suitable embodiment, a DSP block may be configured as a multiplier accumulator circuit having an output register activated by a control signal that is enabled at a frequency that is less than the second (higher) data rate. The multiplier accumulator circuit may include a multiplier, a first register, and a first adder that receives signals from the multiplier and from the first register and that outputs corresponding signals to the first register.

The multiplier accumulator circuit may also include a second register, a second adder that receives signals from the multiplier and from the second register and that outputs corresponding signals to the second register, a first multiplexer that is coupled between the first adder and the first register, a second multiplexer that is coupled between the second adder and the second register, and a third multiplexer having a first input that is coupled to the first register and a second input that is coupled to the second register. The first adder may be a fixed point adder circuit, whereas the second adder may be a floating point adder circuit.

Further features of the present invention, its nature and various advantages will be more apparent from the accompanying drawings and the following detailed description.

DETAILED DESCRIPTION

The present embodiments relate to improving circuit performance in synchronous logic circuits using double clocking techniques. The logic circuits may be part of any suitable integrated circuits. For example, the logic circuits and associated double clocked embedded functional blocks in accordance with at least some embodiments of the present invention may be implemented on programmable logic device integrated circuits. If desired, the embodiments herein may be implemented on programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic. The present invention will generally be described in the context of integrated circuits such as programmable logic device integrated circuits as an example.

It will be recognized by one skilled in the art, that the present exemplary embodiments may be practiced without some or all of these specific details. In other instances, well-known operations have not been described in detail in order not to unnecessarily obscure the present embodiments.

Figure 1:
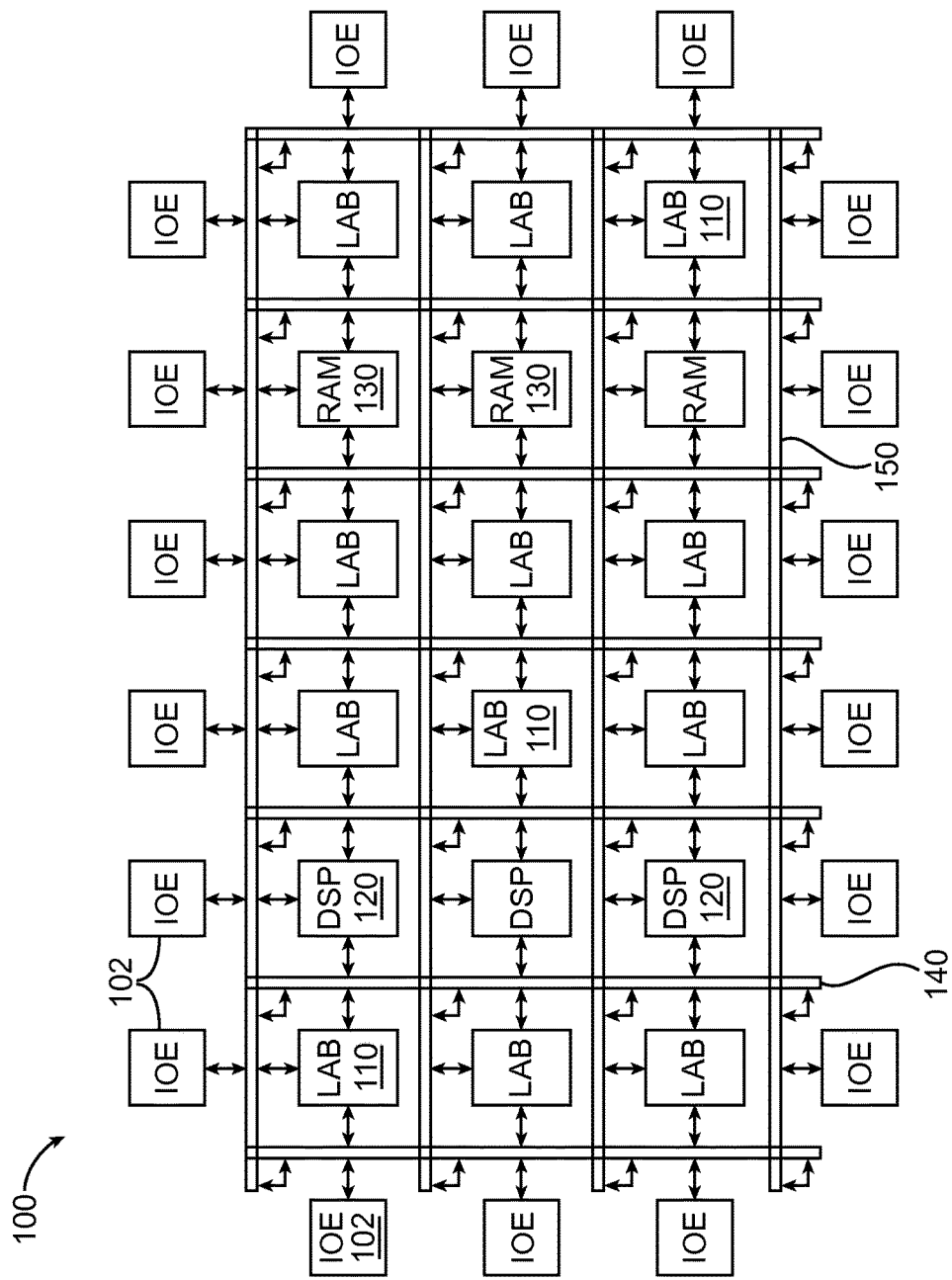
FIG. 1 is a diagram of an illustrative programmable integrated circuit in accordance with an embodiment.

An illustrative integrated circuit such as a programmable logic device (PLD) 100 is shown in FIG. 1. As shown in FIG. 1, PLD 100 may include a two-dimensional array of functional blocks, including logic array blocks (LABs) 110 and other associated functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce corresponding output signals.

Programmable device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

In addition, the programmable logic device may have input/output elements (IOEs) 102 for driving signals off of PLD and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include pipeline elements, and the contents stored in these pipeline elements may be accessed during operation. For example, a programming circuit may provide read and write access to a pipeline element.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that the embodiments described herein may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Not all of the components on a programmable integrated circuit need to operate at the same frequency. In some scenarios, it may be possible to operate certain functional blocks at higher frequencies relative to others to help improve the overall performance of the device. In accordance with an embodiment of the present invention, at least some portion of the programmable device 100 may be optimized to operate at a higher data rate compared to other circuit components on that device.

As an example, one or more DSP blocks 120 on device 100 may be clocked at higher frequencies than the programmable logic regions 110. As another example, one or more RAM blocks 130 may be clocked at higher frequencies compared to the programmable regions 110. As yet another example, the programmable logic regions 110 (sometimes referred to as "soft" logic or "reconfigurable" logic) may be operated at higher frequencies than the DSP blocks or the RAM blocks. In general, the frequency at which DSP block 120 is being operated may be any integer multiple or fractional multiple of the core clock frequency that is controlling other types of functional blocks on the programmable device.

The scenario where the DSP blocks are operated at double the clock frequency relative to the RAM blocks and the soft logic circuitry may be referred to herein for the remaining figures (as an example). Any signals or circuits that are operating at the double data rate may be referred to as "2×", whereas signals or circuits that are operating at the "core" or nominal data rate (which is equal to half the double data rate) may therefore be referred to as "1×".

For example, the soft logic and associated fabric may be operable at 1 GHz, whereas the DSP block is operable to run at 2 GHz (with minimal impact on area and cost). This scheme assumes that the DSP block is optimized (via better circuit design practices and improved data path algorithms within the DSP block itself) to run much faster than the rest of the system (e.g., at least 2 times as fast as the soft logic). If data can be sent to and received from the 2×DSP block efficiently, the overall performance of the device can be substantially improved without increasing die area.

Figure 2:
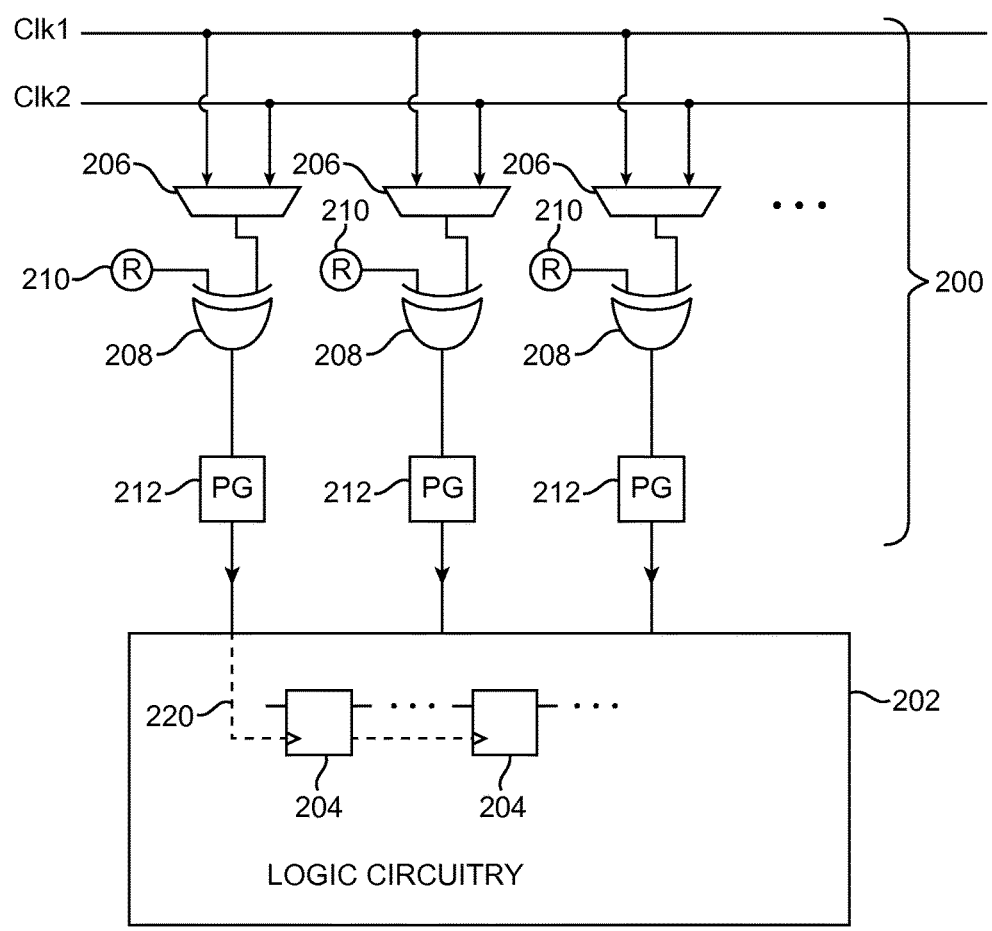
FIG. 2 is a circuit diagram of illustrative clock generation circuitry having clock pulse generators coupled to the output of clock selection multiplexers in accordance with an embodiment.

In accordance with an embodiment, the double clocked DSP configuration may be enabled via use of a clock network that allows the rest of the device to support data transfers to and from the DSP block(s) at the higher data rates. The clock network may, for example, include clock generation circuitry such as clock generation circuitry 200 of FIG. 2 that can be used to generate clock pulses at both rising and falling edges of the 1× core clock signal. As shown in FIG. 2, clock generation circuitry 200 may include a first input that receives a first 1× clock signal Clk1, a second input that receives a second 1× clock signal Clk2, multiple multiplexers 206, logic gates such as logic exclusive-OR (XOR) gates 208, and pulse generators (PG) 212. In general, signals Clk1 and Clk2 may be clock signals with a 50% duty cycle, the same clock frequency but different phases. In other suitable embodiments, signals Clk1 and Clk2 may exhibit different frequencies.

Each multiplexer 206 may include a first input for receiving signal Clk1, a second input for receiving signal Clk2, and an output. Each logic XOR gate 208 may include a first input that is coupled to the output of an associated multiplexer 206, a second input that receives a static control bit from a dedicated memory element 210, and an output that is coupled to a corresponding one of the pulse generators 212. Memory element 210 may be implemented using volatile memory elements such as random-access-memory (RAM) cells or non-volatile memory elements such as fuses, anti-fuses, programmable read-only-memory (ROM) cells, mask-programmed and laser-programmed structures, etc.

Arranged in this way, multiplexer 206 may be configured to route a selected one of signals Clk1 and Clk2 to XOR gate 208. Depending on the polarity of the static control bit that is stored in memory element 210, the clock signal at the output of multiplexer 206 may be passed through logic gate 208 without being inverted (i.e., when the static control bit has a first polarity) or may be inverted when passing through logic gate 208 (i.e., when the static control bit has a second polarity that is different than the first polarity). For example, consider a clock signal Clk being received at the first input of XOR gate 208. In this example, signal Clk can be either Clk1 or Clk2 depending on the configuration of multiplexer 206. If the static control bit is a logic "0", signal Clk may be passed through to the pulse generator. If the static control bit is a logic "1", an inverted version of signal Clk may be passed through to the pulse generator.

Figure 3:
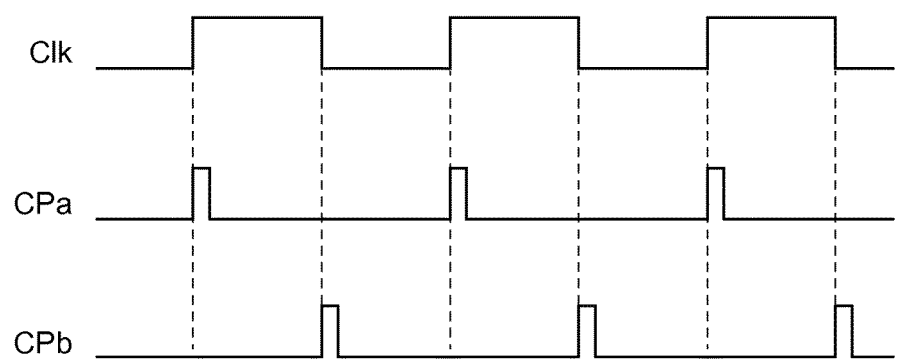
FIG. 3 is a timing diagram illustrating control signals that can be produced using the clock generation circuitry of FIG. 2 in accordance with an embodiment.

Pulse generator 212 may be configured to output a short clock pulse in response to detecting a rising edge at its input. The operation of clock generation circuitry 200 is illustrated in the timing diagram of FIG. 3. As shown in FIG. 3, a first clock pulse signal CPa may be generated for each rising edge in signal Clk when the static control bit is low, whereas a second clock pulse signal CPb may be generated for each falling edge in signal Clk when the static control bit is high (since the falling edge of Clk is converted to a rising edge when being inverted through the logic XOR gate). In the example of FIG. 3, each clock pulse signal is shown to have less than 50% duty cycle. As an example, clock pulse signals CPa and CPb that can be generated at the output of pulse generator 212 exhibits a 10% duty cycle. Since signals CPa and CPb generated by circuitry 200 are pulsed in response to both rising and falling edges of the original 1× clock (e.g., either core clock signal Clk1 or Clk2), these signals can be used to support double clocking on programmable integrated circuit 100 (FIG. 1).

FIG. 2 shows one suitable embodiment where the clock pulse signals are fed to one or more pulsed latches 204 in associated logic circuitry 202. The example of FIG. 2 in which clock generation circuitry 200 has three clock consumer outputs is merely illustrative. If desired, circuitry 200 may be used to generate clock pulse signals for more than three clock consumers, less than three clock consumers, or any suitable number of clock consumers. The use of pulsed latches 204 instead of conventional digital flip-flops (which typically consists of a master and slave latch pair) helps to reduce chip area, to reduce static power consumption, and to relax timing constraints along the data path. The pulsed latches 204 may be transparent-high latches (as an example) and may behave like a digital flip-flop circuit when receiving clock pulse signals with narrow pulse widths.

Logic circuitry 202 in FIG. 2 may be part of a programmable logic region 110 in FIG. 1. This is merely illustrative. In general, clock generation circuitry 200 may be included in any of the DSP blocks 120, the RAM blocks 130, or other embedded functional blocks on the programmable logic device to help support double data rate operation.

The embodiment of FIG. 2 includes clock pulse generators coupled to the output of the clock selection multiplexers 206. In accordance with another suitable embodiment, clock generation circuitry 300 may be provided that includes clock selection multiplexers that are coupled to the output of clock pulse generators (see, e.g., FIG. 4). In particular, clock generation circuitry 300 may be capable of generating a single 2× clock signal.

Figure 4:
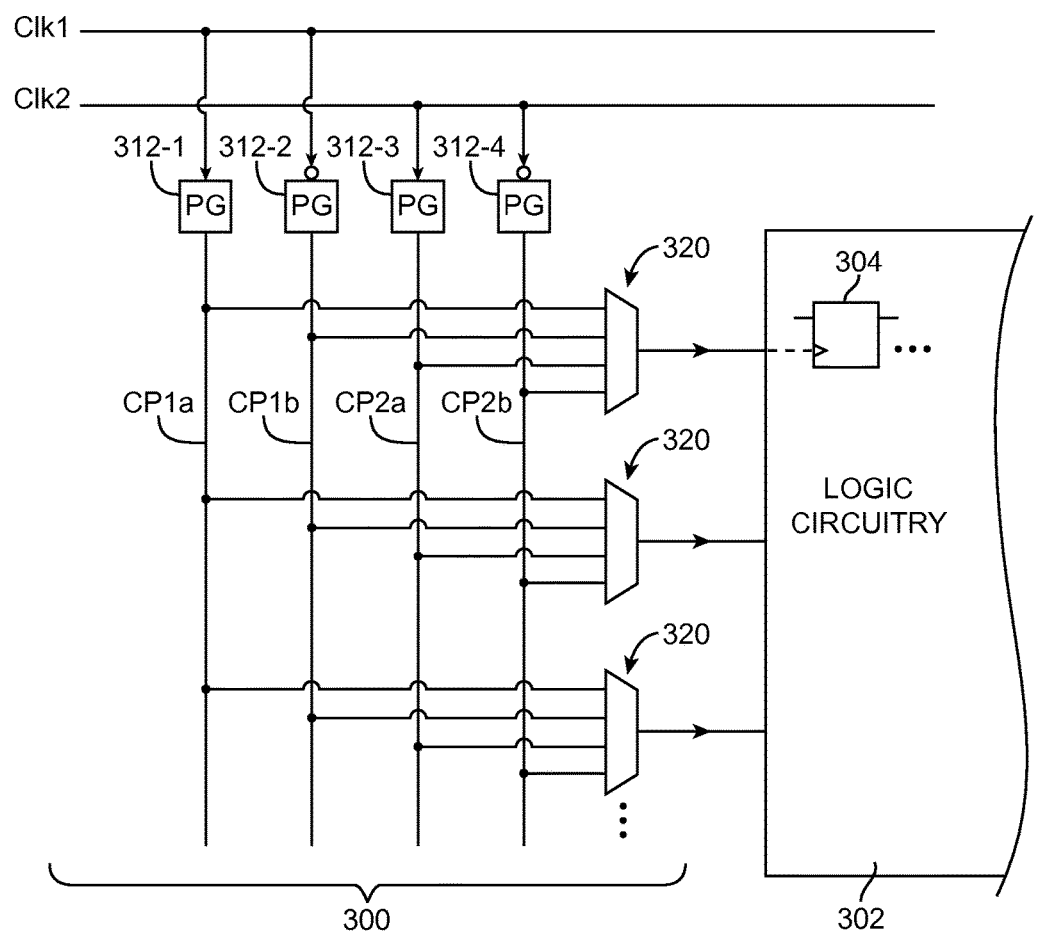
FIG. 4 is a circuit diagram of illustrative clock generation circuitry having clock selection multiplexers that are coupled to the output of clock pulse generators in accordance with an embodiment.

As shown in FIG. 4, clock generation circuitry 300 may have a first input for receiving first 1× clock signal Clk1, second input for receiving a second 1× clock signal Clk2, multiple pulse generators 312, and multiplexers 320. As described above, signals Clk1 and Clk2 may be 50% duty cycle clock signals with the same clock frequency but different phases.

In the example of FIG. 4, the group of pulse generators 312 may include a first pulse generator 312-1 that directly receives signal Clk1, a second pulse generator 312-2 that receives an inversion of signal Clk1 (as indicated by the "bubble" at the input of pulse generator 312-2), a third pulse generator 312-3 that directly receives signal Clk2, and a fourth pulse generator 312-4 that receives an inverted version of signal Clk2 (as indicated by the bubble at its input). Configured in this arrangement, the first pulse generator 312-1 may output a first clock pulse signal CP1a having clock pulses corresponding to rising edges in signal Clk1, whereas the second pulse generator 312-2 may output a second clock pulse signal CP1b having clock pulses corresponding to falling edges in signal Clk1. Similarly, the third pulse generator 312-3 may output a third clock pulse signal CP2a having clock pulses corresponding to rising edges in signal Clk2, whereas the fourth pulse generator 312-4 may output a fourth clock pulse signal CP2b having clock pulses corresponding to falling edges in signal Clk2.

Signals CP1a, CP1b, CP2a, and CP2b generated in this way may be received at respective inputs of each clock selection multiplexer 320. Conventional multiplexers are typically "one-hot" selection (i.e., only the signal at a selected one of the multiplexer inputs can be passed through to the output of the multiplexer at any given point in time). In accordance with another embodiment, clock selection multiplexer 320 can be operable in a "two-hot" selection mode (e.g., at least two signals at a selected pair of the multiplexer inputs can be simultaneously passed through to the multiplexer output).

Figure 5:
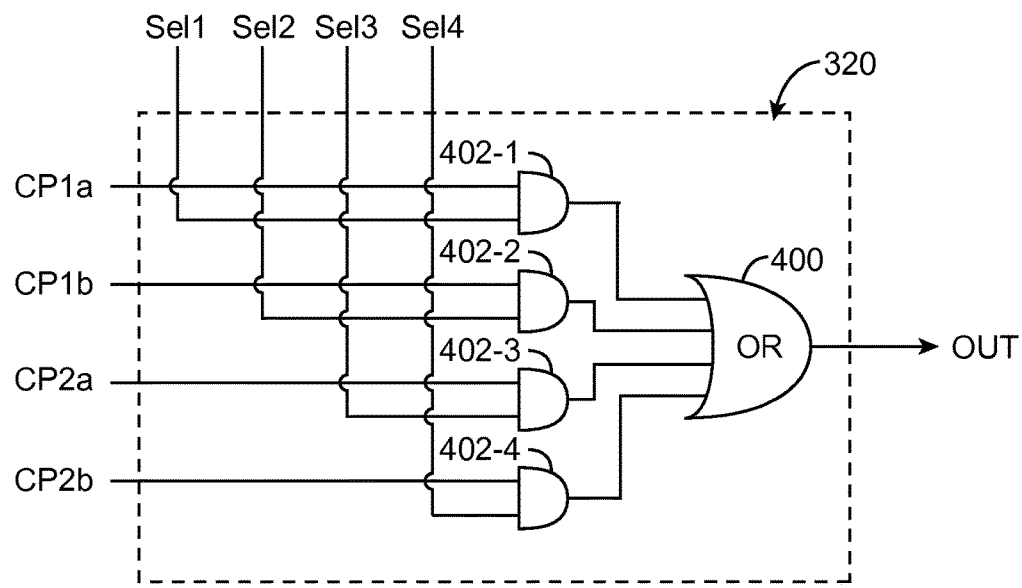
FIG. 5 is a circuit diagram of an illustrative clock selection multiplexer in accordance with an embodiment.

FIG. 5 is a circuit diagram showing one suitable implementation of clock selection multiplexer 320. As shown in FIG. 5, multiplexer 320 may include multiple logic AND gates 402 and a logic OR gate 400 for combining outputs from the different AND gates 402. In particular, a first logic AND gate 402-1 may have a first input that receives signal CP1a from the first pulse generator 312-1, a second input that receives a first multiplexer control signal Sel1, and an output that is coupled to OR gate 400. A second logic AND gate 402-2 may have a first input that receives signal CP1b from the second pulse generator 312-2, a second input that receives a second multiplexer control signal Sel2, and an output that is coupled to OR gate 400. A third logic AND gate 402-3 may have a first input that receives signal CP2a from pulse generator 312-3, a second input that receives a third multiplexer control signal Sel3, and an output that is coupled to OR gate 400. A fourth logic AND gate 402-4 may have a first input that receives signal CP2b from pulse generator 312-4, a second input that receives a fourth multiplexer control signal Sel4, and an output that is coupled to OR gate 400.

Figure 6:
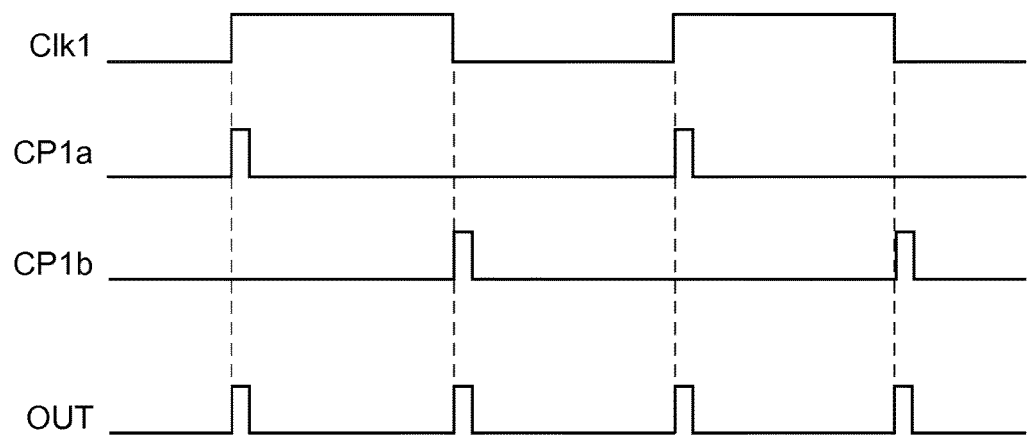
FIG. 6 is a timing diagram illustrating control signals that can be produced using clock generation circuitry of the type shown in FIG. 4 in accordance with an embodiment.

Configured in this way, multiplexer 320 may generate an output signal OUT that is a combination of one or more of the clock pulse signals CP1a, CP1b, CP2a, and CP2b. FIG. 6 is a timing diagram showing one example where the multiplexer output signal OUT includes clock pulses at both the rising and falling edges of signal Clk1. This output may be obtained by simultaneously asserting control signals Sel1 and Sel2 to allow both clock pulse signals CP1a and CP1b to be passed through and combined at the logic OR gate 400. Generating a 2× or "double speed" clock in this way may be useful in supporting the double clocked operation of programmable device 100, as is described below in connection with FIGS. 7-12.

As another example, multiplexer 320 may be configured to generate signal OUT that includes clock pulses at both rising and falling edges of signal Clk2 (e.g., by simultaneously asserting control signals Sel3 and Sel4 to allowed both signals CP2a and CP2b to be passed through and combined at logic OR gate 400). If desired, multiplexer 320 may also be operable in one-hot selection mode (by asserting only one of the control signals Sel1-Sel4). In yet other suitable embodiments, multiplexer 320 may receive more than four clock pulse signals and be configured to support three-hot parallel clock selection, four-hot parallel clock selection, etc. The example of FIG. 5 in which the clock selection multiplexer is implemented using a combination of logic AND gates and an OR gate is merely illustrative. If desired, some combination of logic NAND gates, NOR gates, XOR gates, XNOR gates, inverters, and other suitable logic circuit can be used.

The exemplary arrangement in FIG. 4 shows one suitable embodiment where the clock pulse signals are fed to one or more pulsed latches 304 in associated logic circuitry 302. The example of FIG. 4 in which clock generation circuitry 300 has three clock consumer outputs is merely illustrative. If desired, clock generation circuitry 300 may be used to generate clock pulse signals for more than three clock consumers, less than three clock consumers, or any suitable number of clock consumers. Logic circuitry 302 in FIG. 4 may be part of a programmable logic region 110 in FIG. 1. This is merely illustrative. In general, clock generation circuitry 300 may be included in any of the DSP blocks 120, the RAM blocks 130, or other embedded functional blocks on the programmable logic device to help support double data rate operation. The embodiments described in connection with FIGS. 2-6 in which the clock generation circuitry receives a core clock signal having a first frequency and generates output clock signals having a second frequency that is twice the first frequency is merely illustrative. If desired, the clock generation circuitry may be modified such that the second frequency is any integer multiple of the first frequency or such that the first frequency is any integer multiple of the second frequency (e.g., for dividing down the core clock signal).

Figure 7:
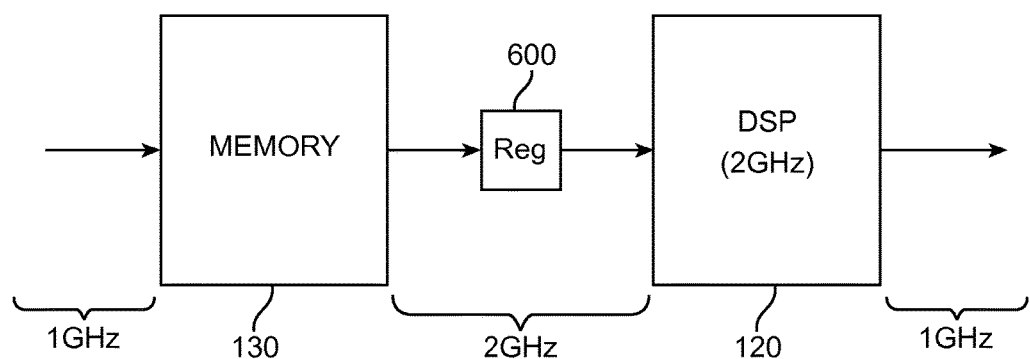
FIG. 7 is a diagram illustrating the concept of "data concentration" at the output of a memory block and the concept of "data spreading" at the output of a digital signal processing (DSP) block in accordance with an embodiment.

To support the use of a double rate DSP block, the DSP block should be fed data at twice the nominal rate relative to the rest of the programmable fabric. A common source of input data for the DSP block is a memory block such as a RAM block 130 in FIG. 1. An exemplary setup is shown in FIG. 7. As shown in FIG. 7, memory block 130 may feed data to DSP block 120. One or more pipeline register 600 may be interposed between memory block 130 and DSP block 120 to provide a pipelined data path and can help increase throughput.

As it is often challenging to double the internal speed of a memory block, memory block 130 may be provided with a 2× data rate conversion interface at its output. For example, data can be read from memory block 130 at a 2 W width inside the memory but double pumped at a 1 W width at the interface to the DSP block. For example, pairs of 8-bit words can be read in parallel from a memory block 130 at 1 GHz while individual 8-bit words can be successively fed to a corresponding DSP block 120 at 2 GHz. This scheme of converting data retrieved at 1× operation to a 2× output data stream is sometimes referred to herein as "concentration" of data. Generally, it may be desirable for the routing connecting a 1× memory block to a 2×DSP block to be relatively short (e.g., the DSP block should be immediately adjacent to or at least in the immediate vicinity of the memory block on chip) to ensure that the 2× output data stream from the memory is able to properly maintain a desired level of signal integrity.

Figure 8:
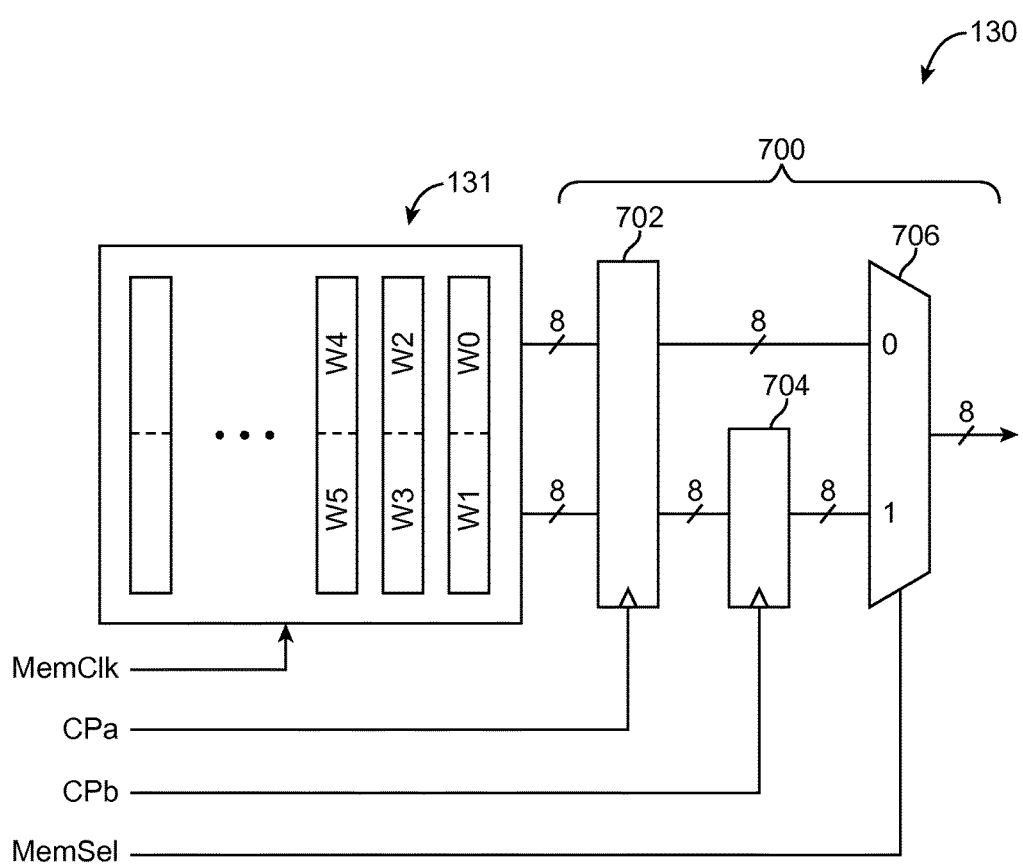
FIG. 8 is a diagram showing a memory output data rate doubling circuit in accordance with an embodiment.

FIG. 8 shows how data stored within a memory block 130 can be converted from 1× internal operation to a 2× output stream via use of a memory output data rate doubling circuit in accordance with another embodiment. As shown in FIG. 8, memory block 130 may include a memory array 131 that is coupled to memory output data rate doubling circuit 700. Memory array 131 may be configured to store words of data (e.g., words w0, w1, w2, w3, w4, w5, etc.), where each word includes 8 bits of data (as an example). In particular, memory array 131 may be read out using a 1× internal memory clock signal MemClk. In the example of FIG. 8, a first pair of words w0 and w1 may be read out at a first rising edge of MemClk, a second pair of words w2 and w3 may be read out at a second rising edge of MemClk, a third pair of words w4 and w5 may be read out at a third rising edge of MemClk, and so on.

Data rate doubling circuit 700 may include a first data register 702 that receives data directly from memory array 131, a data selection multiplexer 706, and a second data register 704 that is interposed between the first data register 702 and multiplexer 706. First data register 702 may have a first input that sequentially receives 8-bit words from memory array 131 (e.g., words w0, w2, w4, etc.) and a second input that sequentially receives 8-bit words (e.g., words w1, w3, w5, etc.) from memory array 131 in response to rising edges of signal MemClk. As described above, the data words may arrive in pairs: words w0 and w1 may arrive at the first rising edge of MemClk, words w2 and w3 may arrive at the second rising edge of MemClk, etc. Register 702 may be controlled using a clock pulse signal CPa (e.g., a clock pulse signal triggered by rising edges of a core clock signal). When signal CPa is asserted, data words arriving at the first input of register 702 may be passed through to a first register output while data words arriving at the second input of register 702 may be passed through to a second register output.

Multiplexer 706 may have a first (0) input that receives data from the first register output of register 702, a second (1) input that receives data from the second register output of register 702 via interposing register 704, and an output. Interposing register 704 may be used to buffer only half the data words that are being output from memory array 131. Register 704 may be controlled using a clock pulse signal CPb (e.g., a clock pulse signal triggered by falling edges of a core clock signal). When CPb is asserted, data words being output from the second register output of register 702 may be passed through register 704 to the second input of multiplexer 706. Signals CPa and CPb may be generated from a common core clock signal using clock generation circuitry of the type described in connection with FIGS. 2 and 4 (as examples).

Figure 9:
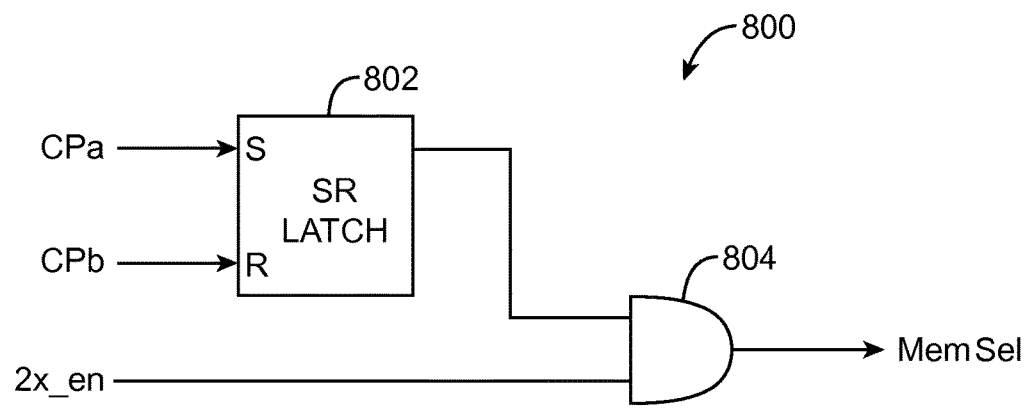
FIG. 9 is a diagram of an illustrative double clocking mode selection circuit in accordance with an embodiment.

Multiplexer 706 may be configured to route signals from its first and second inputs to its output in an alternating fashion (e.g., by repeatedly toggling multiplexer control signal MemSel). FIG. 9 is a diagram of an illustrative double clocking mode selection circuit 800 that can be used to generate signal MemSel. As shown in FIG. 9, selection circuit 800 may include a set-reset (SR) latch 802 and a logic AND gate 804. Latch 802 may have a set (S) input that receives clock pulse signal CPa, a reset (R) input that receives clock pulse signal CPb, and a latch output. The logic AND gate 804 may have a first input that is coupled to the output of SR latch 802, a second input that receives a double clocking mode enable signal 2×_en, and an output at which signal MemSel is generated. The particular implementation of circuit 800 in FIG. 9 is merely illustrative. If desired, other types of latching circuits and logic gates can be used to generate multiplexer control signal MemSel.

Figure 10:
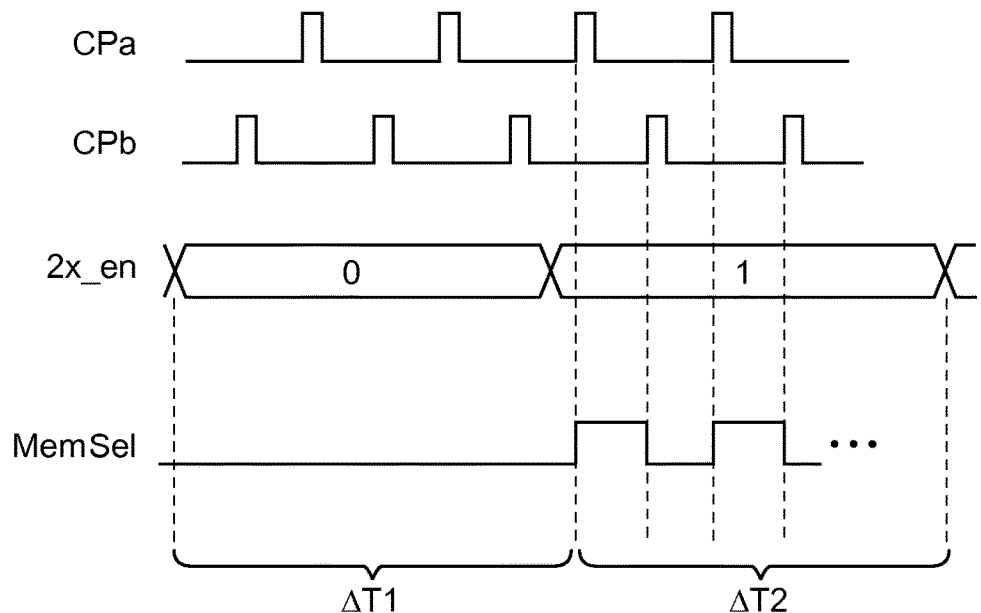
FIG. 10 is a timing diagram showing relevant waveforms that illustrate the operation of the double clocking mode selection circuit of FIG. 9 in accordance with an embodiment.

FIG. 10 is a timing diagram that illustrates the operation of double clocking mode selection circuit 800. When enable signal 2×_en is deasserted (i.e., when signal 2×_en is at logic "0"), signal MemSel may be forced to a static low signal by logic AND gate 804 (as shown during period ΔT1). This mode corresponds to a 1× operating mode for which multiplexer 706 only routes the signal from its first input to its output at the nominal clocking rate of signal CPa.

When enable signal 2×_en is asserted (i.e., when signal 2×_en is at logic "1"), signal MemSel may become a 50% clock signal having rising edges triggered by the clock pulses in signal CPa and falling edges triggered by the clock pulses in signal CPb. This mode corresponds to a 2× operating mode for which multiplexer 706 selectively routes data words from its first input to its output when signal MemSel is low and routes data words from its second input to its output when signal MemSel is high (as shown during period ΔT2). Configured in this way, data rate doubling circuit 700 (FIG. 8) can be used to generate a double pumped output stream at the output of multiplexer 706. In yet other suitable embodiments, register 704 may be selectively bypassed during 1× operation to support parallel generation of data word pairs at each rising edge of signal CPa. The memory output data rate doubling/concentration scheme described above in connection with FIGS. 8-10 is merely illustrative and does not serve to limit the scope of the present invention. If desired, other suitable ways of providing data concentration at the output of an embedded memory block on a programmable logic device may be used.

Referring back to FIG. 7, DSP block 120 that is operating at the 2× data rate may output data that needs to be converted back to the core data rate before it can be fed to other 1× embedded functional blocks on the programmable device (e.g., functional blocks such as RAM block 130 and programmable logic block 110 in FIG. 1). This scheme of converting data generated at 2× speed to a 1× output data stream is sometimes referred to herein as data "spreading." FIGS. 11A, 11B, 11C, and 11D are diagrams of illustrative DSP output data rate spreading circuits in accordance with one or more embodiments.

Figure 11A:
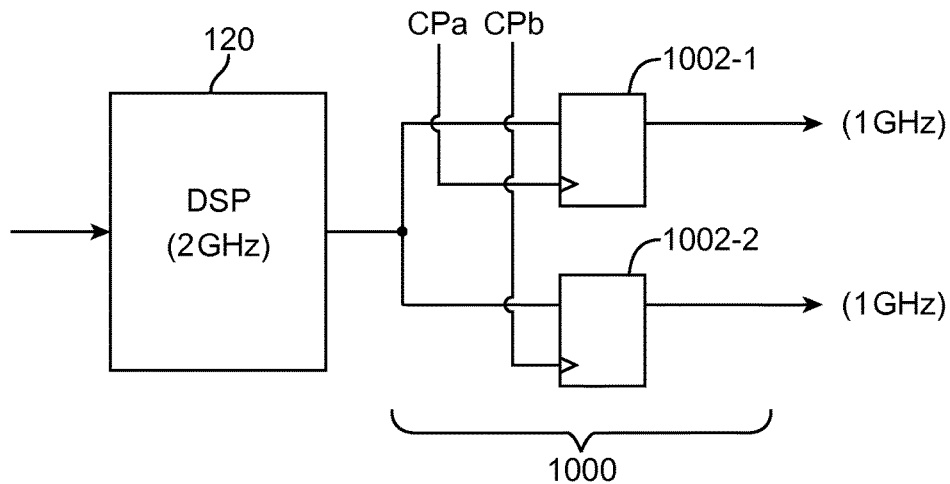
FIGS. 11A, 11B, 11C, and 11D are diagrams of illustrative DSP output data rate spreading circuits in accordance with one or more embodiments.

FIG. 11A shows one suitable arrangement in which a DSP block 120 operating at 2 GHz is outputting data to a data rate halving circuit 1000. As shown in FIG. 11A, data rate halving circuit 1000 may include a first register 1002-1 and a second register 1002-2 that receive data from DSP block 120. As an example, registers 1002-1 and 1002-2 may be registers that are part of the same logic element in programmable logic device 100 (FIG. 1). In particular, register 1002-1 may be controlled using signal CPa, whereas register 1002-2 may be controlled using signal CPb. Configured in this way, register 1002-1 may output a first data stream at 1 GHz when signal CPa is pulsed high while register 1002-2 may output a second data stream at 1 GHz when signal CPb is pulsed high (e.g., registers 1002-1 and 1002-2 may serve to spread the 2 GHz data stream at the output of DSP block 120 into at least two individual 1 GHz data streams).

Figure 11B:
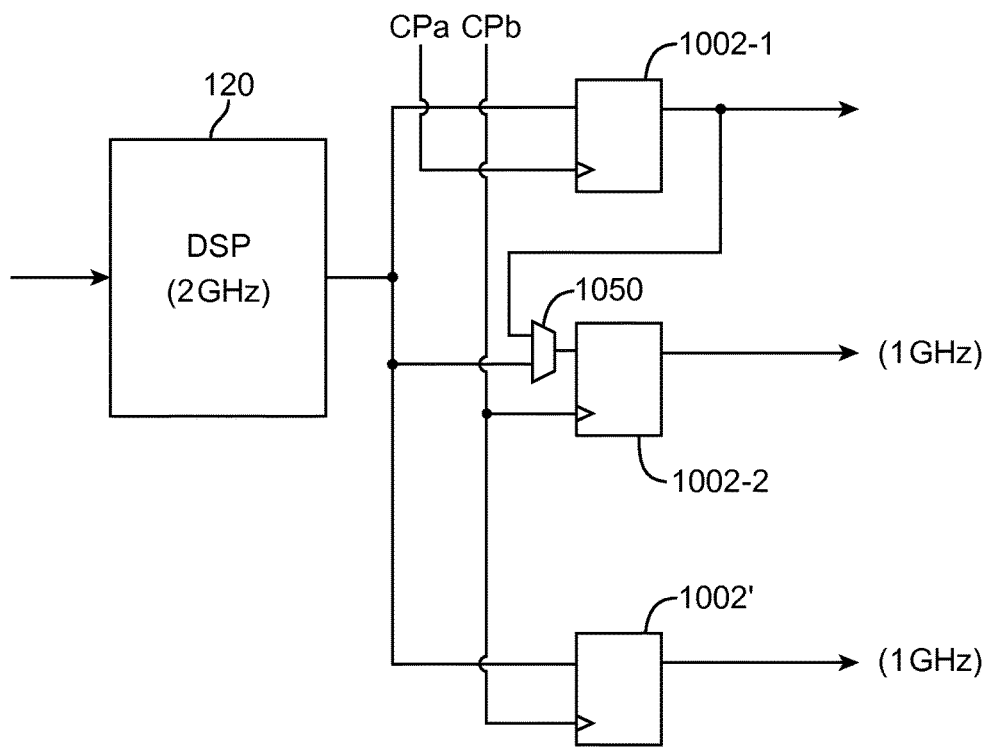

In the example of FIG. 11A, registers 1002-1 and 1002-2 may be toggled out of phase with one another. FIG. 11B shows another suitable arrangement in which the 1× data streams at the output of the data rate halving circuit are synchronized or "aligned" with one another. As shown in FIG. 11B, the data rate halving circuit at the output of the DSP block 120 may further include a multiplexer 1050 and an additional register 1002' (which may or may not be in the same logic array block but is part of another logic element on the programmable logic device). Multiplexer 1050 may have a first input that receives data from register 1002-1, a second input that receives data directly from the DSP block 120, and an output that is coupled to the input of register 1002-2.

In particular, register 1002-1 may be controlled by signal CPa, whereas both registers 1002-2 and 1002' are controlled by signal CPb. During data spreading modes, multiplexer 1050 may be configured to route data from its first input to its output. Configured in this way, a first subset of the output data is provided at the output of register 1002-2 through register 1002-1 and multiplexer 1050, whereas a second subset of output data that is different than the first subset is provided at the output of register 1002'. Since registers 1002-2 and 1002' are both clocked using signal CPb, the first and second subsets of output data are realigned or synchronized with each other. 1× output signals generated in this way are aligned with the slower core clock signal and can therefore be handled by the rest of the programmable device.

Figure 11C:
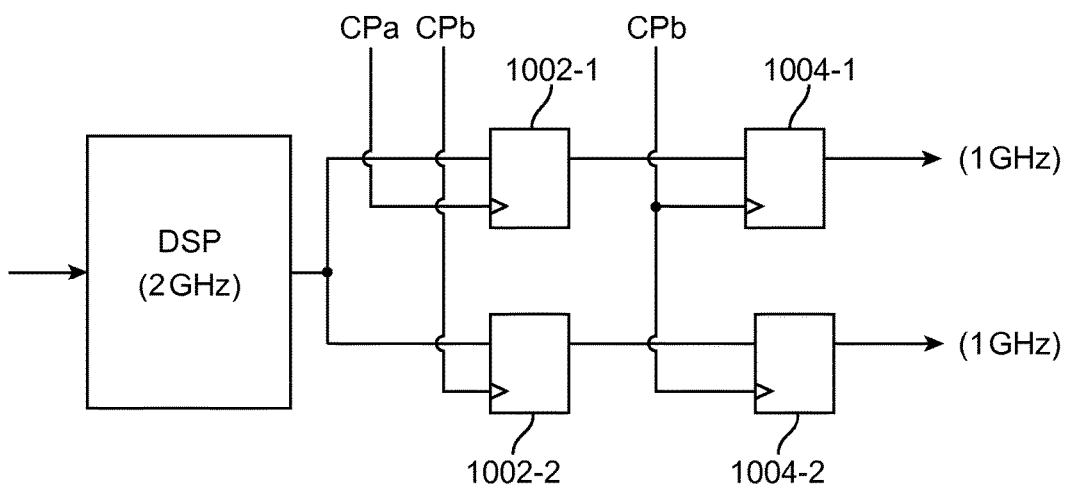

FIG. 11C shows another suitable realignment scheme in which the data rate halving circuit includes a first additional register 1004-1 that is coupled in series with register 1002-1 and a second additional register 1004-2 that is coupled in series with register 1002-2. Registers 1004-1 and 1004-2 may or may not be in the same logic array block and may be part of the same or another logic element on the programmable logic device. Registers 1004-1 and 1004-2 may both be controlled by signal CPb. Configured in this way, register 1004-1 may output a first subset of data at 1 GHz while register 1004-2 outputs a second subset of data that is different than the first subset of data at 1 GHz.

Figure 11D:
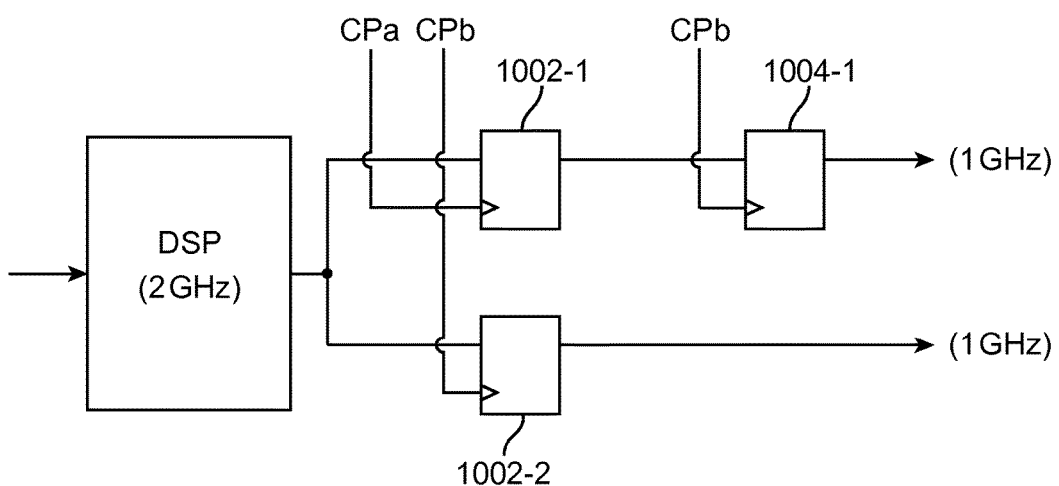

FIG. 11D shows yet another suitable realignment scheme in which the data rate halving circuit includes one additional register 1004-1 that is coupled in series with register 1002-1. Register 1004-1 may or may not be in the same logic array block and may be part of the same or another logic element on the programmable logic device. Registers 1002-2 and 1004-1 may both be controlled by signal CPb. Configured in this way, register 1004-1 may output a first subset of data at 1 GHz while register 1002-2 outputs a second subset of data that is different than the first subset of data at 1 GHz.

The exemplary configurations as shown in FIGS. 11A, 11B, 11C, and 11D are merely illustrative and do not serve to limit the scope of the present invention. In general, the data spreading circuitry of FIGS. 11A-11D may be implemented as part of the soft logic that is separate from the DSP block or as non-reconfigurable or "hard" logic that is part of the DSP block. If desired, other ways of implementing a data rate reduction circuit at the output of a DSP block may be used.

The examples described above in which the data concentration circuitry is formed at the interface between the memory array output and the DSP block input and in which the data spreading circuitry is formed at the output of the DSP block is merely illustrative. In general, the data concentration circuitry may be formed at any suitable interface between any two embedded functional blocks, where a slower functional block is feeding a faster functional block. Likewise, the data spreading circuitry may be formed at any suitable interface between any two embedded functional blocks, where a high speed functional block is feeding a lower speed functional block.

Figure 12A:
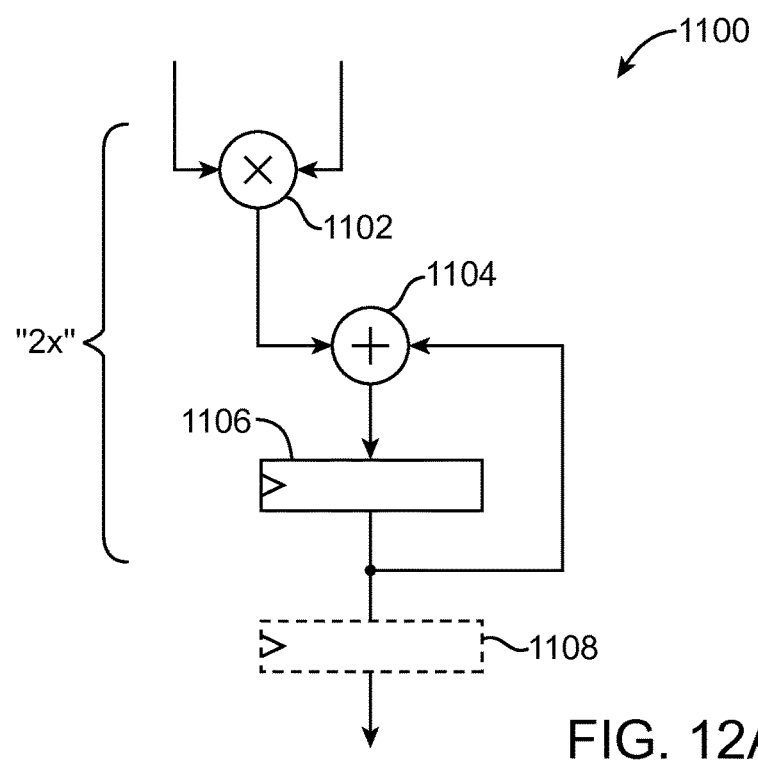
FIGS. 12A and 12B are diagrams of illustrative accumulator output data rate reduction circuits in accordance with one or more embodiments.

In accordance with another embodiment, the DSP blocks within a programmable integrated circuit are often configured to operate as a multiplier accumulator. FIG. 12A shows one suitable implementation of an accumulator circuit 1100 that is provided with output data rate reduction circuitry. As shown in FIG. 12A, multiplier accumulator 1100 may include a multiplier 1102, an adder 1104, a first register 1106, and a second optional output register 1108.

In accordance with an embodiment, accumulator 1100, adder 1104, and register 1106 may be operated at 2× data rate, whereas output register 1108 may be enabled or clocked once every k number of accumulations (e.g., register 1108 may be activated once every 10 accumulations, once every 100 accumulations, once every 1000 accumulations, etc.). Register 1108 may be a register that is part of the soft programmable fabric circuitry on the integrated circuit device. If desired, register 1108 may also be formed as part of the DSP block and can be bypassable when the DSP is operated at 1× speed. In general, output register 1108 may be enabled using: (1) an internal counter (e.g., a user loadable counter that is enabled after some predetermined number of clock cycles to reduce the 2× operation of the multiplier accumulator by any suitable integer multiple), (2) an external control signal, or (3) one of the 1× clock pulse signals CPa or CPb (i.e., to reduce the output to the normal speed).

Figure 12B:
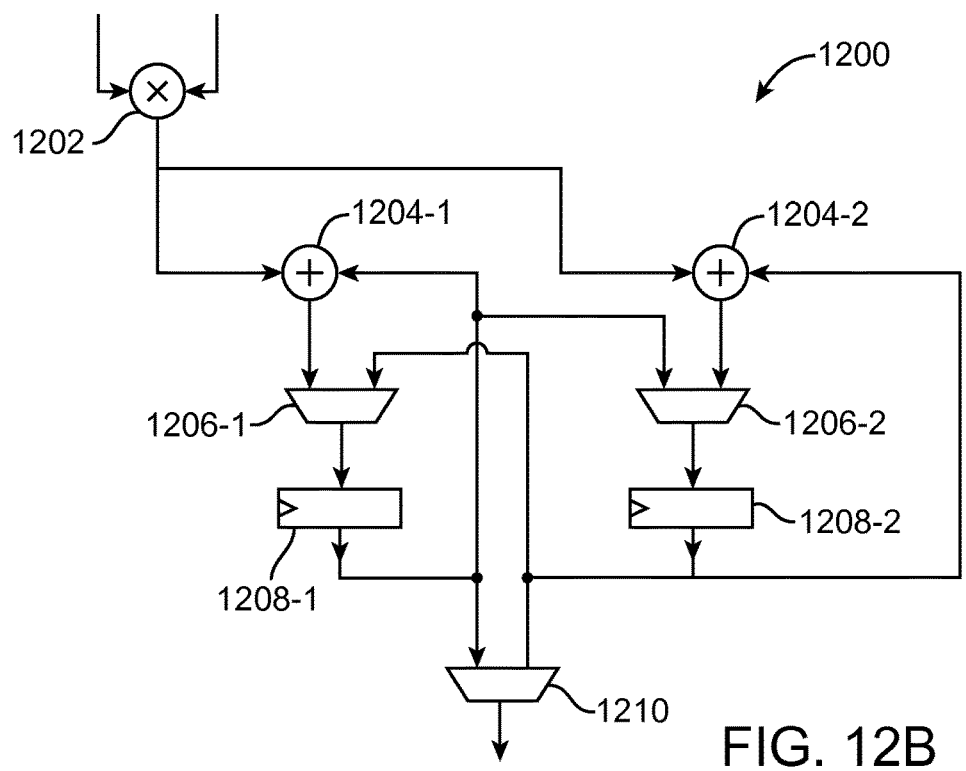

In accordance with another embodiment, the DSP block may also be configured to operate as a multiplier accumulator 1200 that has both fixed point and floating point adder circuits and that is provided with output data rate reduction circuitry (see, e.g., FIG. 12B). As shown in FIG. 12B, accumulator 1200 may include a multiplier 1202, a fixed point adder 1204-1, a floating point adder 1204-2, a first multiplexer 1206-1, a second multiplexer 1206-2, a first output register 1208-1, a second output register 1208-2, and an output multiplexer 1210. Multiplier 1202 can be configured as a fixed point multiplier or a floating point multiplier. Adder 1204-1, in conjunction with register 1208-1, can be used to implement a fixed point accumulator. Adder 1204-2, in conjunction with register 1208-2, can be used to implement a floating point accumulator.

In particular, fixed point adder 1204-1 may have a first input that is coupled to the output of multiplier 1202, a second input that is coupled to the output of register 1208-1, and an output. Similarly, floating point adder 1204-2 may have a first input that is coupled to the output of multiplier 1202, a second input that is coupled to the output of register 1208-2, and an output. Multiplexer 1206-1 may have a first input that is coupled to the output of adder 1204-1, a second input that is coupled to the output of register 1208-2, and an output that is coupled to the input of register 1208-1. Multiplexer 1206-2 may have a first input that is coupled to the output of adder 1204-2, a second input that is coupled to the output of register 1208-1, and an output that is coupled to the input of register 1208-2. Output multiplexer 1210 may have a first input that is coupled to the output of register 1208-1, a second input that is coupled to the output of register 1208-2, and an output at which a selected one of the signals at its first and second inputs is routed.

A multiplier accumulator 1200 configured in this way may operate at 2× speed while output multiplexer 1210 will feed a lower 1× speed (or other fractional data rate) to the soft logic fabric. In the case of floating point accumulation, register 1208-2 may be updated at the higher frequency. After a predetermined number of accumulations, the value of register 1208-2 can be latched by register 1208-1 through multiplexer 1206-1. This will allow register 1208-2 to be reset immediately while preserving the value in register 1208-1 so that the value in register 1208-1 can be read out by a potentially much slower external system. The fixed point accumulation can similarly be retimed through a clock crossing mechanism using floating point accumulator register 1208-2 and multiplexer 1206-2.

The exemplary multiplier accumulator configurations of FIGS. 12A and 12B are merely illustrative and do not serve to limit the scope of the present invention. If desired, other ways of implementing a data rate reduction circuit for a DSP block configured as a multiplier accumulator circuit may be used.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An integrated circuit, comprising:
    a first functional block operating at a first data rate, wherein the first functional block comprises a memory block;
    a second functional block operating at a second data rate that is greater than the first data rate, wherein the second functional block comprises a digital signal processing (DSP) block;
    data rate concentration circuitry that receives stored data from the first functional block at the first data rate and that outputs the stored data at the second data rate to the second functional block; and
    data rate spreading circuitry that receives processed data generated by the second functional block at the second data rate and that outputs the processed data at the first data rate, wherein the data rate spreading circuitry comprises:
        a first register that receives the processed data from the DSP block and that is controlled by a first clock pulse signal toggling at the first data rate; and
        a second register that receives the processed data from the DSP block and that is controlled by a second clock pulse signal that is different than the first clock pulse signal and that is also toggling at the first data rate, wherein the first clock pulse is defined by a first rising edge and a first falling edge, wherein the second clock pulse is defined by a second rising edge and a second falling edge, wherein the second rising edge is different than the first rising edge, and wherein the second falling edge is different than the first falling edge.

2. The integrated circuit defined in claim 1, wherein the second data rate is double the first data rate.

3. The integrated circuit defined in claim 1, wherein the first functional block is physically immediately adjacent to the second functional block on the integrated circuit.

4. The integrated circuit defined in claim 1, wherein the data rate concentration circuitry comprises:
    a register that receives a first group of data and a second group of data that is different than the first group of data from a memory array; and
    a multiplexer having a first input that receives the first group of data from the register and a second input that receives the second group of data from the register.

5. The integrated circuit defined in claim 4, wherein the data rate concentration circuitry further comprises:
    an additional register that only receives the second group of data from the memory array and that is coupled to the second input of the multiplexer.

6. The integrated circuit defined in claim 5, wherein the register is controlled by a first clock pulse signal toggling at the first data rate, and wherein the additional register is controlled by a second clock pulse signal that is different than the first clock pulse signal and that is also toggling at the first data rate.

7. The integrated circuit defined in claim 1, further comprising:
    programmable logic circuitry that receives the processed data at the first data rate from the data rate spreading circuitry.

8. The integrated circuit defined in claim 1, wherein the data rate spreading circuitry further comprises:

a multiplexer interposed between the first register and the second register; and a third register that receives the processed data from the DSP block and that is controlled by the second clock pulse signal.

9. The integrated circuit defined in claim 1, wherein the data rate spreading circuitry further comprises:
a third register that is coupled in series with the first register, wherein the third register is controlled by a selected one of the first and second clock pulse signals.

10. The integrated circuit defined in claim 1, wherein the data rate spreading circuitry further comprises:
a third register that is coupled in series with the first register; and
a fourth register that is coupled in series with the second register, wherein third and fourth registers are controlled by a selected one of the first and second clock pulse signals.

11. An integrated circuit, comprising:
a first embedded functional block that operates at a first clock frequency;
a second embedded functional block that operates at a second clock frequency that is a multiple of the first clock frequency; and
clock generation circuitry that receives a core clock signal at the first clock frequency and that generates corresponding output clock signals at the second clock frequency, wherein the output clock signals facilitate communications between the first and second embedded functional blocks, and wherein the clock generation circuitry comprises:
a first pulse generator that generates first clock pulse signals at rising edges of the core clock signal; and
a second pulse generator that generates second clock pulse signals at falling edges of the core clock signal; and
a multiplexer that receives the first and second clock pulse signals from the first and second pulse generators and receives third and fourth clock pulse signals from additional pulse generators, wherein the multiplexer comprises a two-hot selection multiplexer.

12. The integrated circuit defined in claim 11, wherein the two-hot selection multiplexer includes a logic OR gate.

13. An integrated circuit, comprising:
a programmable logic block operating at a first clock rate; and
a digital signal processor (DSP) block operating at a second clock rate that is greater than the first clock rate, wherein the DSP block is configured as a multiplier accumulator circuit having an output register activated by a control signal that is enabled at a frequency that is less than the second clock rate, wherein the multiplier accumulator circuit comprises:
a multiplier;
a first register; and
a first adder that receives signals from the multiplier and from the first register and that outputs corresponding signals to the first register.

14. The integrated circuit defined in claim 13, wherein the multiplier accumulator circuit further comprises:
a second register; and
a second adder that receives signals from the multiplier and from the second register and that outputs corresponding signals to the second register.

15. The integrated circuit defined in claim 14, wherein the first adder comprises a fixed point adder circuit, and wherein the second adder comprises a floating point adder circuit.

16. The integrated circuit defined in claim 14, wherein the multiplier accumulator circuit further comprises:
a first multiplexer that is coupled between the first adder and the first register;
a second multiplexer that is coupled between the second adder and the second register; and
a third multiplexer having a first input that is coupled to the first register and a second input that is coupled to the second register.

17. The integrated circuit defined in claim 13, wherein the output register is bypassed when the digital signal processor is configured to operate at the first clock rate.

* * * * *